United States Patent
Hiramatsu et al.

(10) Patent No.: US 6,559,782 B2
(45) Date of Patent: May 6, 2003

(54) METHOD OF DETERMINING MEASURING TIME FOR AN ANALOG-DIGITAL CONVERTER

(75) Inventors: Tomonobu Hiramatsu, Musashino (JP); Shinichi Tanida, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/891,788

(22) Filed: Jun. 26, 2001

(65) Prior Publication Data

US 2002/0030616 A1 Mar. 14, 2002

(30) Foreign Application Priority Data

Jun. 29, 2000 (JP) ......................................... 2000-195917

(51) Int. Cl.[7] ............................................... H03M 1/10
(52) U.S. Cl. ....................................... 341/120; 341/155
(58) Field of Search ............................... 341/120, 118, 341/121, 119

(56) References Cited

U.S. PATENT DOCUMENTS 5,294,926 A * 3/1994 Cororan ...................... 341/120

FOREIGN PATENT DOCUMENTS

JP 06258383 9/1994

* cited by examiner

Primary Examiner—Brian Young

(57) ABSTRACT

In order to shorten the measuring time of an analog-digital converter for measuring very small currents with its resolution unchanged, a method of determining the measuring time for the analog-digital converter which comprises the steps of preliminarily measuring current to be measured, determining a voltage range and a current range used for measurement, and determining the measuring time for an analog-digital converter for current measurement on the basis of the determined voltage and current ranges, and the measured current value is provided.

11 Claims, 1 Drawing Sheet

METHOD OF DETERMINING MEASURING TIME FOR AN ANALOG-DIGITAL CONVERTER

BACKGROUND OF THE INVENTION

1. Field of the Invention

The present invention relates to a method of determining a measuring time for an analog-digital converter and, more particularly, to a method of determining a measuring time for an analog-digital converter used for measuring minute signals with high accuracy.

2. Description of the Related Art

Conventionally, an apparatus called a source monitor unit (SMU) has been used to test the characteristics of semiconductor devices, such as an FET or IC. A semiconductor testing apparatus usually has a plurality of SMUs, each of which is connected to each terminal of a semiconductor device to be measured. A main measuring circuit comprising an SMU controller, a microprocessor, a RAM, and a ROM is connected to each SMU via an analog-digital converter and a digital-analog converter for input and output, respectively. The analog-digital converter is used to digitize signals from a semiconductor device to be measured. The digital-analog converter is used to convert digital signals from the main measuring circuit into analog signals and supply current and voltage to the semiconductor device to be measured. In such cases, various analog-digital converters are used for different purposes according to their characteristics. A semiconductor testing apparatus is usually equipped with a plurality of types of analog-digital converters, such as integral analog-digital converters and successive comparison analog-digital converters.

In recent years the operating voltage and power consumption of a semiconductor circuit have decreased considerably, so smaller current or voltage values need to be measured. The measuring range of an analog-digital converter therefore has widened. The higher its resolution becomes, the stricter the signal-noise ratio requirement becomes.

Spot measurements, being the most basic measurements for a semiconductor testing apparatus using an SMU, will be performed in compliance with the following procedure:

1. Measure the current running through the SMU and search for a current range with which the highest resolution can be obtained;
2. Change the current range of the SMU to the suitable current range found;
3. Connect the input to an analog-digital converter and the output from the SMU;
4. In order to obtain the desired signal-noise ratio, perform analog-digital conversion after setting integrating time or the number of times measured values are averaged, depending on an analog-digital converter used; and
5. Treat digital data thus obtained as a result of this measurement.

In this case, noise must be eliminated from signals to be measured in order to obtain the desired signal-noise ratio for an analog-digital converter. Noise to be considered here are usually classified into three categories: (1) 1/f noise, (2) white noise (also called thermal noise), and (3) a noise component synchronizing with the power supply frequency. It is difficult to eliminate 1/f noise. Noise synchronizing with power supply voltage can be largely eliminated by setting the measuring time longer than or equal to one cycle of the power supply. White noise can be reduced by setting the measuring time represented by integrating time or the number of times of measurements over which measured values are averaged (the number of times of measurements over which measured values are averaged is the number of times measurements are performed with a successive comparison analog-digital converter, and an increase in this number represents a longer measuring time).

In principle, the longer the measuring time for analog-digital conversion becomes, the more noise can be eliminated. However, it takes a longer time to measure. Main factors which determine the magnitude of noise components included in the signal to be measured are (1) set voltage range, (2) current range used for measurement, and (3) strength of current running through an SMU. In order to obtain the desired signal-noise ratio, it is necessary to determine the measuring time for analog-digital conversion with the above factors taken into consideration and perform analog-digital conversion. A conventional technique has taken into consideration only (1) the set voltage range and (2) the current range used for measurement described above and has determined the measuring time for analog-digital conversion statically on the basis of a table (or relational expression). The measuring time of analog-digital conversion for very small signals is shown in Table 1. In this example, this table is applicable to any of set voltage ranges of 2 V, 20 V, 40 V, and 100 V, and any value within any of these ranges can be used as the set voltage. The measuring time of analog-digital conversion is 16 PLCs (power line cycles) and is uniform. (1 PLC is equal to 20 milliseconds with power supply of 50 cycles/second.) The strength of current running through an SMU described above is not taken into consideration, so this value is determined on the assumption that the signal-noise ratio is worst (when the value of the current running through an SMU is smaller than or equal to 10% of the maximum measurable current value). Therefore, if a current value measured is large compared to the maximum current value, then the efficiency of the measuring time is low. Making it possible to measure even smaller currents will strengthen this tendency, resulting in more wasteful use of the measuring time.

TABLE 1

| Current Range | Analog-digital Conversion Time |
|---|---|
| 100 mA | 16 PLC |
| 10 mA | 16 PLC |
| 1 mA | 16 PLC |
| 100 µA | 16 PLC |
| 10 µA | 16 PLC |
| 1 µA | 16 PLC |
| 100 nA | 16 PLC |
| 10 nA | 16 PLC |
| 1 nA | 16 PLC |
| 100 pA | 16 PLC |
| 10 pA | 16 PLC |

FIG. 1 is a graph showing the relations between the signal-noise ratios for thermal noise and the measured current values for measuring times of 1, 2, 4, 8, and 16 PLCs. This graph shows theoretical values at 23° C. and in the 10 pA range (range resistance 45 GΩ).

Another conventional technique uses two-dimensional tables for the measuring time with the output current and output voltage ranges of an SMU taken into consideration for the purpose of reducing noise. Such tables are held in a semiconductor testing apparatus as internal data. These tables are prepared according to the desired resolution or signal-noise ratio range and one of them is selected for actual use. This method makes it possible to select the best table if a signal to be measured is within a limited range. However, if a signal to be measured changes significantly during the sweep measurement, shortening the analog-digital conversion time for the purpose of shortening the measuring time will lower the signal-noise ratio for very small signals. Moreover, increasing the signal-noise ratio by lengthening the analog-digital conversion time will lead to the use of longer measuring times for large signals, which will lengthen the entire measuring time. The compatibility of high resolution with the quickness of measurements therefore has been desired.

SUMMARY OF THE INVENTION

An object of the present invention therefore is to shorten the measuring time for an analog-digital converter without affecting the resolution.

The present invention provides a method for determining the measuring time for an analog-digital converter in which the measuring time for an analog-digital converter is determined according to voltage and current ranges selected for a current to be measured and a current value measured preliminarily.

Furthermore, the present invention provides a method of determining measuring time for an analog-digital converter which comprises the steps of preliminarily measuring a current to be measured, determining a voltage range and a current range used for measurement, and determining the measuring time of an analog-digital converter for current measurement on the basis of the determined voltage and current ranges and the measured current value. In this case, it is preferable that the ratio of the measured current value to a full scale in each current range should be calculated and that measuring time should be determined on the basis of the ratio.

In addition, the present invention provides a method of determining the measuring time for analog-digital conversion which comprises the steps of generating a plurality of functions defining measuring time for different analog-digital converters as functions of a voltage range and current range for current to be measured, selecting two or more from the plurality of functions generated, and combining the selected functions, and selecting a comparatively long measuring time for a comparatively weak-current signal and a comparatively short measuring time for a comparatively strong-current signal from measuring time calculated from the selected functions. It is preferable that a boundary range should be set and that the two or more functions should be combined with the boundary range as a boundary. In this case, a function is the fixed relation between two or more variables and may, for example, be mathematical expression or a numerical table.

In this case, it is preferable that an analog-digital converter should be connected to an SMU in a semiconductor testing apparatus. The meaning of measuring time depends on the type of an analog-digital converter. That is to say, it means the integrating time for an integral analog-digital converter and the number of times of measurements over which measured values are averaged for a successive comparison analog-digital converter. The measuring time is also a parameter for analog-digital converters of other types, which corresponds to the integrating time or the number of times measured values are averaged.

DETAILED DESCRIPTION OF THE PREFERRED EMBODIMENTS

Figure 1:
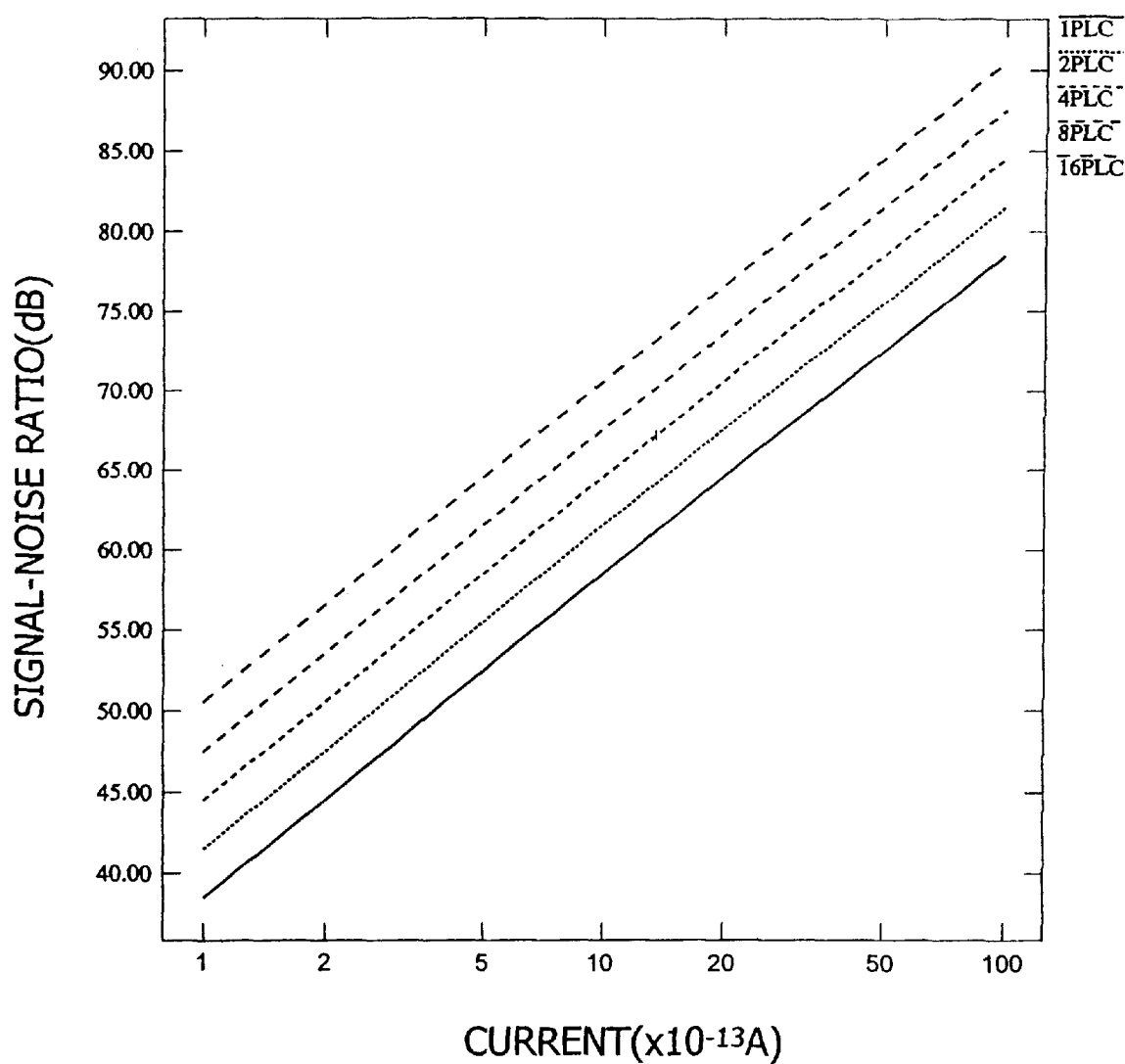
FIG. 1 is a graph showing the relations between the theorertical values of signal-noise ratios for thermal noise and those of the measured currents with respect to measuring times of 1, 2, 4, 8, and 16 PLCs.

In a first embodiment of the present invention, first a current value is measured by a preliminary measurement. Which current range to be used is determined on the basis of the current value obtained. Then, the ratio of the measured value to a full scale in this current range (%FS) is calculated. The ratio obtained is applied to Table 2 illustrated below, the ratio of the actual measuring time to a defined value given to that current range is found, and the measuring time actually used is found. In this example, a rather long measuring time is set because the signal-noise ratio is regarded as important. If the signal-noise ratio is not so important, a shorter measuring time can be used.

TABLE 2

| Current Value (% FS) | Analog-digital Converter Measuring Time | When Long Table is used |
| --- | --- | --- |
| ~10% | defined value | 16 PLC |
| 10%~14% | defined value/2 | 8 PLC |
| 14%~20% | defined value/4 | 4 PLC |
| 20%~30% | defined value/8 | 2 PLC |
| 30%~40% | defined value/16 | 1 PLC |

Tables 3(a), 3(b), and 3(c) are given by obtaining measured values, %FS, measuring time (analog-digital conversion time), theoretical values for thermal noise (at 25° C.), and signal-noise ratios for each measuring range. As shown in Tables 2, 3(a), 3 (b), and 3 (c), if a measured current value is greater than 10% of a full scale in a measuring range, the analog-digital conversion time (measuring time) can be shortened by 8–15 PLCs by comparison with conventional techniques. The measuring time will be shortened by 160–300 milliseconds with a power supply frequency of 50 cycles/second. On the other hand, the execution time the software requires for calculating a measuring range and a ratio to a full scale in that measuring range (%FS) from the result of preliminary measurement will be negligible by comparison with the measuring time cut. According to the example shown here, therefore, measuring time will be shortened by a maximum of 300 milliseconds, which will improve the entire measuring speed significantly.

TABLE 3

| Measured Value | % FS | Analog-digital Conversion Time | Theoretical Value for Thermal Noise [A] | S/N [dB] |
| --- | --- | --- | --- | --- |
| (a) 10 pA range | | | | |
| 100 fA | 1% | 16 PLC | 1.06E − 15 | 39 |
| 1 pA | 10% | 16 PLC | 1.06E − 15 | 59 |
| 2 pA | 20% | 4 PLC | 2.12E − 15 | 59 |
| 4 pA | 40% | 1 PLC | 4.24E − 15 | 59 |
| 10 pA | 100% | 1 PLC | 4.24E − 15 | 67 |
| (b) 100 pA range | | | | |
| 1 pA | 1% | 16 PLC | 3.18E − 15 | 50 |
| 10 pA | 10% | 16 PLC | 3.18E − 15 | 70 |
| 20 pA | 20% | 4 PLC | 6.36E − 15 | 70 |
| 40 pA | 40% | 1 PLC | 1.27E − 14 | 70 |
| 100 pA | 100% | 1 PLC | 1.27E − 14 | 78 |

TABLE 3-continued

| Measured Value | % FS | Analog-digital Conversion Time | Theoretical Value for Thermal Noise [A] | S/N [dB] |
|---|---|---|---|---|
| (c) 1 nA range | | | | |
| 10 pA | 1% | 16 PLC | 1.01E − 14 | 60 |
| 100 pA | 10% | 16 PLC | 1.01E − 14 | 80 |
| 200 pA | 20% | 4 PLC | 2.01E − 14 | 80 |
| 400 pA | 40% | 1 PLC | 4.02E − 14 | 80 |
| 1 nA | 100% | 1 PLC | 4.02E − 14 | 88 |

Descriptions have been given with spot measurements as an example, but all advanced measurements including sweep measurements and search measurements may be performed by making the use of spot measurements. The improvement of speed in spot measurements immediately leads to the improvement of speed in advanced measurements. Tables 2, 3(a), 3(b), and 3(c) are shown simply as examples. The present invention is never limited to the selection of numeric values shown there.

In a second embodiment of the present invention, measuring time for analog-digital conversion, such as integrating time or the number of times of measurements over which measured values are averaged, is determined with an output current range and an output voltage range for an SMU as parameters. In this embodiment, therefore, a plurality of tables or functions are prepared and two or more of these tables or functions are combined for use. Now, an example in which two of four tables prepared are combined will be described.

The four tables prepared have the following characteristics:

[Manual table] The measuring time is the same for all voltage and current ranges. However, a short measuring time is adopted because the speed of measurements is regarded as important. The desired resolution therefore will not be ensured. It is manually possible to lengthen the measuring time by several folds, so this is called "Manual" table.

[Short table] In order to realize the compatibility of resolution with speed to some extent, a long measuring time is set for a weak signal and a short measuring time is set for a strong signal. Really the optimum measuring time largely depends on an object to be measured, so it will be difficult to obtain the desired resolution for very small signals.

[Medium table] The measuring time is the same for all current and voltage ranges. A long measuring time is adopted because resolution is regarded as important, which also results in a long measuring time for strong signals.

[Long table] This is the same with the Medium Table described above, but a longer measuring time is set.

Specific examples of the Short and Long Tables are shown as Tables 4 and 5 respectively.

TABLE 4

Short Table
(Units are in milliseconds)

| | Voltage Range | | | |
|---|---|---|---|---|
| Current Range | 2 V | 20 V | 40 V | 100 V |
| 100 mA | 0.48 | 0.48 | 0.48 | 0.48 |
| 10 mA | 0.48 | 0.48 | 0.48 | 0.48 |
| 1 mA | 0.48 | 0.48 | 0.48 | 0.48 |
| 100 μA | 0.48 | 0.48 | 0.48 | 0.48 |
| 10 μA | 0.96 | 0.96 | 1.92 | 1.92 |
| 1 μA | 0.48 | 0.48 | 0.48 | 0.48 |
| 100 nA | 4.8 | 7.68 | 7.68 | 9.6 |
| 10 nA | 1.92 | 1.92 | 1.92 | 3.84 |
| 1 nA | 1.92 | 1.92 | 1.92 | 3.84 |
| 100 pA | 3.84 | 3.84 | 3.84 | 3.84 |
| 10 pA | 7.68 | 7.68 | 7.68 | 7.68 |

TABLE 5

Long Table
(Units are in milliseconds)

| | Voltage Ranges | | | |
|---|---|---|---|---|
| Current Range | 2 V | 20 V | 40 V | 100 V |
| 100 mA | 320 | 320 | 320 | 320 |
| 10 mA | 320 | 320 | 320 | 320 |
| 1 mA | 320 | 320 | 320 | 320 |
| 100 μA | 320 | 320 | 320 | 320 |
| 10 μA | 320 | 320 | 320 | 320 |
| 1 μA | 320 | 320 | 320 | 320 |
| 100 nA | 320 | 320 | 320 | 320 |
| 10 nA | 320 | 320 | 320 | 320 |
| 1 nA | 320 | 320 | 320 | 320 |
| 100 pA | 320 | 320 | 320 | 320 |
| 10 pA | 320 | 320 | 320 | 320 |

The contents of the Manual and Medium Tables are the same as those of Table 1 etc., so their examples are omitted daringly. The present invention realizes the maintenance of resolution and the shortening of the measuring time by combining two or more of these tables and using the tables thus obtained. To be specific, for example, a screen for setting an analog-digital converter displayed by software as an interface with an operator makes it possible to specify whether or not the combination of tables according to the present invention should be performed. In that case, a current (or voltage) range as the boundary for the combination can be set. That is to say, two or more tables are combined and the measuring time is determined on the basis of the Combined Table independently of a current value measured in a current range (but dependently on a current range). This is different from the above first embodiment in which the measuring time used is varied dynamically according to an actual current value.

Table 6 below is an example of the Combined Table made by combining the Long and Short Tables. Software can produce this combined table easily by specifying the Long and Short Tables as ones to be combined and setting the 10 μA range as the boundary between them. In this case, it is possible to change the measuring time in a portion of the Combined Table corresponding to the Short Table and a portion of the Combined Table corresponding to the Long Table from the value in the original tables by giving different base time to each of the tables to be combined.

TABLE 6

(Units are in milliseconds)

| Current Range | Voltage Range | | | |
|---|---|---|---|---|
| | 2 V | 20 V | 40 V | 100 V |
| Short Table | | | | |
| 100 mA | 0.48 | 0.48 | 0.48 | 0.48 |
| 10 mA | 0.48 | 0.48 | 0.48 | 0.48 |
| 1 mA | 0.48 | 0.48 | 0.48 | 0.48 |
| 100 μA | 0.48 | 0.48 | 0.48 | 0.48 |
| 10 μA | 0.96 | 0.96 | 0.96 | 1.92 |
| 1 μA | 0.48 | 0.48 | 0.48 | 0.48 |
| 100 nA | 4.8 | 7.68 | 7.68 | 9.6 |
| 10 nA | 1.92 | 1.92 | 1.92 | 3.84 |
| 1 nA | 1.92 | 1.92 | 1.92 | 3.84 |
| 100 pA | 3.84 | 3.84 | 3.84 | 3.84 |
| 10 pA | 7.68 | 7.68 | 7.68 | 7.68 |
| Long Table | | | | |
| 100 mA | 320 | 320 | 320 | 320 |
| 10 mA | 320 | 320 | 320 | 320 |
| 1 mA | 320 | 320 | 320 | 320 |
| 100 μA | 320 | 320 | 320 | 320 |
| 10 μA | 320 | 320 | 320 | 320 |
| 1 μA | 320 | 320 | 320 | 320 |
| 100 nA | 320 | 320 | 320 | 320 |
| 10 nA | 320 | 320 | 320 | 320 |
| 1 nA | 320 | 320 | 320 | 320 |
| 100 pA | 320 | 320 | 320 | 320 |
| 10 pA | 320 | 320 | 320 | 320 |
| Combined Table | | | | |
| 100 mA | 0.48 | 0.48 | 0.48 | 0.48 |
| 10 mA | 0.48 | 0.48 | 0.48 | 0.48 |
| 1 mA | 0.48 | 0.48 | 0.48 | 0.48 |
| 100 μA | 0.48 | 0.48 | 0.48 | 0.48 |
| 10 μA | 320 | 320 | 320 | 320 |
| 1 μA | 320 | 320 | 320 | 320 |
| 100 nA | 320 | 320 | 320 | 320 |
| 10 nA | 320 | 320 | 320 | 320 |
| 1 nA | 320 | 320 | 320 | 320 |
| 100 pA | 320 | 320 | 320 | 320 |
| 10 pA | 320 | 320 | 320 | 320 |

By selecting the Long Table for a weak signal and the Short Table for a strong signal in this way, small signals can be measured with high resolution by the use of a sufficiently long measuring time and a strong signal can be measured at high speed by the use of a short measuring time. Other combinations of the tables are possible, of course. In addition, various boundary ranges can be selected. Furthermore, three or more tables can be combined.

In the first embodiment of the present invention, the optimum measuring time is selected with an actually-measured current value taken into consideration, so the entire measuring time can be shortened with resolution unchanged.

In the second embodiment of the present invention, the measuring time will be automatically optimized especially when a phenomenon changing continuously from small signals to strong signals is measured by sweep measurements. This can combine a high speed a measurement and measurement with high resolution. Furthermore, the same effect will be obtained in all kinds of measurements applying sweep measurements, such as a linear search and binary search.

The entire disclosure of Japanese Patent Application No. 2000-195917 filed on Jun. 29, 2000 including the specification, claims, drawings and summary are incorporated herein by reference in its entirety.

What is claimed is:

1. A method of determining a measuring time for an analog-digital converter, comprising the steps of preliminarily measuring a current to be measured; determining a voltage range and a current range to be used for measurement; and determining the measuring time for an analog-digital converter for current measurements on the basis of the determined voltage and current ranges and the measured current value.

2. The method according to claim 1, wherein the ratio of the measured current value to a full scale in each current range is calculated, and the measuring time is determined on the basis of the ratio.

3. A method of determining measuring time for analog-digital conversion, comprising the steps of generating a plurality of functions defining measuring time for different analog-digital converters as functions of a voltage range and a current range for current to be measured; selecting two or more from the plurality of functions generated; and combining the selected functions and selecting a comparatively long measuring time for a comparatively weak-current signal and a comparatively short measuring time for a comparatively strong-current signal from measuring time obtained from the selected functions.

4. The method according to claim 3, wherein a boundary range is set, and the two or more functions are combined with the set boundary range as a boundary.

5. The method according to claim 3, wherein the functions are tables.

6. The method according to claim 1, wherein the analog-digital converter is connected to an SMU in a semiconductor testing apparatus.

7. The method according to claim 2, wherein the analog-digital converter is connected to an SMU in a semiconductor testing apparatus.

8. The method according to claim 1, wherein the measuring time is integrating time for an analog-digital converter.

9. The method according to claim 2, wherein the measuring time is intergrating time for an analog-digital converter.

10. The method according to claim 1, wherein the measuring time corresponds to the number of times of measurements over which measured values are averaged by an analog-digital converter.

11. The method according to claim 2, wherein the measuring time corresponds to the number of times of measurements over which measured values are averaged by an analog-digital converter.

* * * * *